United States Patent
Shi

(10) Patent No.: US 9,466,751 B1
(45) Date of Patent: Oct. 11, 2016

(54) AVALANCHE PHOTODIODE HAVING ELECTRIC-FIELD CONFINEMENT BY MESAS

(71) Applicant: National Central University, Taoyuan (TW)

(72) Inventor: Jin-Wei Shi, Taoyuan (TW)

(73) Assignee: NATIONAL CENTRAL UNIVERSITY, Taoyuan (TW)

(*) Notice: Subject to any disclaimer, the term of this patent is extended or adjusted under 35 U.S.C. 154(b) by 0 days.

(21) Appl. No.: 15/060,787

(22) Filed: Mar. 4, 2016

(51) Int. Cl.
*H01L 31/107* (2006.01)
*H01L 31/0224* (2006.01)
*H01L 31/0304* (2006.01)

(52) U.S. Cl.
CPC ..... *H01L 31/107* (2013.01); *H01L 31/022408* (2013.01); *H01L 31/03046* (2013.01)

(58) Field of Classification Search
CPC ............. H01L 31/1075; H01L 31/107; H01L 31/02027
USPC ............................. 257/84, 186, 438; 438/34
See application file for complete search history.

(56) References Cited

U.S. PATENT DOCUMENTS

| | | | |
|---|---|---|---|
| 2002/0117697 A1* | 8/2002 | Tanaka | H01L 31/02161 257/288 |
| 2008/0274573 A1* | 11/2008 | Shi | H01L 27/153 438/34 |
| 2009/0315073 A1* | 12/2009 | Shi | H01L 31/02027 257/185 |
| 2010/0163925 A1* | 7/2010 | Ishibashi | H01L 31/1075 257/186 |
| 2011/0164645 A1* | 7/2011 | Shi | H01S 5/0261 372/50.11 |
| 2011/0241150 A1* | 10/2011 | Ishibashi | H01L 31/1075 257/438 |
| 2013/0082286 A1* | 4/2013 | Finkelstein | H01L 31/0336 257/84 |
| 2013/0154045 A1* | 6/2013 | Ishibashi | H01L 31/1075 257/438 |

* cited by examiner

*Primary Examiner* — Jerome Jackson, Jr.
*Assistant Examiner* — Bo Fan
(74) *Attorney, Agent, or Firm* — Jackson IPG PLLC; Demian K. Jackson

(57) ABSTRACT

A novel photodetecting device having field confined by mesas is provided. The device is an avalanche photodiode (APD) of indium aluminum arsenide (InAlAs). The device has epitaxial layers with a multiplication layer at bottom as a cathode. Hence, the strongest electric field is confined inside the bottom of the device to avoid surface breakdown. Double mesa is used to confine the electric field of the multiplication layer. Furthermore, a composite multiplication layer with supper thin thickness and wide bandgap is used to reduce the tunneling dark current. Hence, the thickness of equivalent multiplication layer can be reduced to enhance sensitivity.

14 Claims, 6 Drawing Sheets

US 9,466,751 B1

AVALANCHE PHOTODIODE HAVING ELECTRIC-FIELD CONFINEMENT BY MESAS

TECHNICAL FIELD OF THE INVENTION

The present invention relates to a photodetecting device; more particularly, relates to an avalanche photodiode (APD) having an M-layer at bottom of epitaxial layers as a cathode to confined strongest field of the multiplication layer inside the bottom to avoid surface breakdown, where double mesa is used to confine the field of the multiplication layer.

DESCRIPTION OF THE RELATED ART(S)

To meet the demand for the internet of things (IOT) of larger virtual system and big data, it has long been unable to take on the traditional copper wire transmission task (≥~100 m). It is still bound only to the bottomless transmission bandwidth of fiber. In consideration of the market size, cost and expected technology development for different transmission distances, four transmission interface are worked out for 400 Gigabit Ethernet (GbE) for different distances, which are 100 meters (m), 500 m, 2 kilo-meters (km) and 10 km. Therein, 400 giga-bits per second (Gbps) for 100 m is almost certain to use direct modulation signal of vertical cavity surface emitting laser (VCSEL @ 850 nm) for 25 Gbps per channel in multimode fiber (MMF) for 100 GbE. But, laser and optical fiber have to be multiplied for four times to achieve 400 Gbps. The distance more than 500 m will use 1310 nanometers (nm) light source for transmission in single-mode fiber (SMF). The standards for 400 GbE may include standards for signal speeds of each single light source at 50 Gbps or 100 Gbps, and, then, eight or four channels (multiple wavelengths in a single fiber or a single wavelength in multiple fibers) are used to achieve 400 Gbps transmission. However, when the light speed of a single source reaches >25 Gbps in Ethernet, the optoelectronic components for high bandwidth (including a electro-optical modulator in the transmission module and a photodetector in a receiver module, etc.) has a small output optical power (about 1 milliwatts (mW); −2 to +2 decibel-milliwatts (dBm)). If the wavelength division multiplexing (WDM) technology is used, the insertion loss inside the passive components will make the power budget confine the maximum transmission. In a first document (M. Nada, T. Yoshimatsu, Y. Muramoto, H. Yokoyama, and H. Matsuzaki, "Design and Performance of High-Speed Avalanche Photo-diodes for 100-Gb/s Systems and Beyond," IEEE/OSA Journal of Lightwave Technology, vol. 33, no. 5, pp. 984-990, March, 2015.), the insertion loss shows that the receiving end needs a sensitivity about −13 dBm. A general receiver of p-i-n photodiode has only a sensitivity about −10 dBm at a bandwidth of 25 giga-bits per second (Gbit/sec).

In FIG. 5, a second document (E. Ishimura, E. Yagyu, M. Nakaji, S. Ihara, K. Yoshiara, T. Aoyagi, Y. Tokuda, and T. Ishikawa, "Degradation Mode Analysis on Highly Reliable Guarding-Free Planar InAlAs Avalanche Photodiodes, "IEEE/OSA Journal of Lightwave Technology, vol. 25, pp. 3686-3693, December, 2007.) proposed to use planar aluminum indium arsenide (InAlAs) as an avalanche photodiode of a multiplication layer. As shown in the figure, although a zinc diffusion region confines the electric field, no mesa exists so that the electric field at the edge is poorly confined. The threshold of breakdown field (>550 kilo-volts per centimeter (kV/cm)) can be easily exceeded. When the M-layer is shrunken to achieve the desired operating gain, the edge will have breakdown.

FIG. 6 shows 25 Gbit/sec and 50 Gbit/sec breakdown photodiode developed by NTT Electronic (i.e. the first document). As shown in the figure, for achieving a good confinement to electric field, an avalanche layer of InAlAs and an N-contact layer are especially placed close to surface (inverted structure) so that most of the electric field of the avalanche layer is confined under the N-contact layer. But, in order to reduce the probability of surface breakdown, the excess edge-field buffer layer and the N-charge layer are needed, which may have impact on speed. Moreover, the inverted structure (p-side down) needs to use a wide-bandgap p-type InP based alloy and will result in difficulty in producing the ohmic contact and make the resistance of the whole device become big. In addition, this structure will sacrifice the field confinement at the p-type absorption layer, so that the parasitic capacitance is likely to become large. In the mean time, because the absorption layer has a strong fringe field, the packaging of the device become difficult (A third document: F. Nakajima, M. Nada, and T. Yoshimatsu "High-Speed Avalanche Photodiode and High-Sensitivity Receiver Optical Sub-Assembly for 100-Gb/s Ethernet," to be published in IEEE/OSA Journal of Lightwave Technology, vol. 33, 2015.). Thus, in the second document, for confining electric field, the multiplication layer is made at outside and exposed in the air, which will cause reliability problem.

The first document shows sensitivities at 25 Gbit/sec and 50 Gbit/sec. It is clearly observed that the sensitivities at 25 Gbit/sec and 50 Gbit/sec are −15.5 dBm and −11 dBm, respectively. By comparing to 25 GHz and 50 GHz optical receiver modules of pin PD based, responses increases about 4 decibel (dB) and 1.5 dB. Hence, as data rate increases, the increase in sensitivity of the avalanche photodiode will be smaller. This is most likely that, because the bandwidth needs to be increased, the multiplication layer has to become thin, which makes the dark current sharply raised and sensitivity deteriorated.

Hence, the prior arts may not fulfill all users' requests on actual use.

SUMMARY OF THE INVENTION

The main purpose of the present invention is to form epitaxial layers of an avalanche photodiode having an M-layer at bottom as a cathode for confining strongest field of the multiplication layer inside the bottom to avoid surface breakdown, where double mesa is used to confine the field of the multiplication layer.

Another purpose the present invention is to form a composite multiplication layer to reduce tunneling dark current with supper thin thickness and wide bandgap, where the thickness of equivalent multiplication layer is shrunken for enhancing sensitivity.

To achieve the above purposes, the present invention is a novel structure of avalanche photodiode, comprising a p-type ohmic contact layer, an n-type ohmic contact layer, a window layer, a first graded bandgap layer, a first absorption layer, a second absorption layer, a second graded bandgap layer, a field buffer layer, a first p-type field control layer, a multiplication layer and an n-type contact layer, where the p-type ohmic contact layer is a first semiconductor of $p^+$-type doped; the n-type ohmic contact layer is a second semiconductor of $n^+$-type doped; the window layer is a third semiconductor of $p^+$-type doped; the first graded bandgap layer is a fourth semiconductor of $p^+$-type doped; the first absorption layer is a fifth semiconductor of p⁻-type graded doped; the second absorption layer is a sixth semiconductor of undoped; the second graded bandgap layer is a seventh semiconductor of undoped; the field buffer layer is an eighth semiconductor of undoped; the first p-type field control layer is a ninth semiconductor of p⁻-type doped; the multiplication layer is a tenth semiconductor of undoped; the n-type contact layer is an eleventh semiconductor of n⁻-type doped; the window layer is inserted between the p-type ohmic contact layer and the n-type ohmic contact layer; the first graded bandgap layer is inserted between the window layer and the n-type ohmic contact layer; the first absorption layer is inserted between the first graded bandgap layer and the n-type ohmic contact layer; the second absorption layer is inserted between the first absorption layer and the n-type ohmic contact layer; the second graded bandgap layer is inserted between the second absorption layer and the n-type ohmic contact layer; the field buffer layer is inserted between the second graded bandgap layer and the n-type ohmic contact layer; the first p-type field control layer is inserted between the field buffer layer and the n-type ohmic contact layer; the multiplication layer is inserted between the first p-type field control layer and the n-type ohmic contact layer; the n-type contact layer is inserted between the multiplication layer and the n-type ohmic contact layer; and the photodetecting device is a device of 'n-side (M-layer) down' epitaxial layers having a first mesa between the first absorption layer and the second absorption layer and a second mesa between the second graded bandgap layer and the field buffer layer to confine electric field in the photodetecting device by the first mesa and the second mesa. Accordingly, a novel photodetecting device having field confined by mesas is obtained.

BRIEF DESCRIPTION OF THE DRAWINGS

The present invention will be better understood from the following detailed description of the preferred embodiments according to the present invention, taken in conjunction with the accompanying drawings, in which.

DESCRIPTION OF THE PREFERRED EMBODIMENTS

Figure 1:
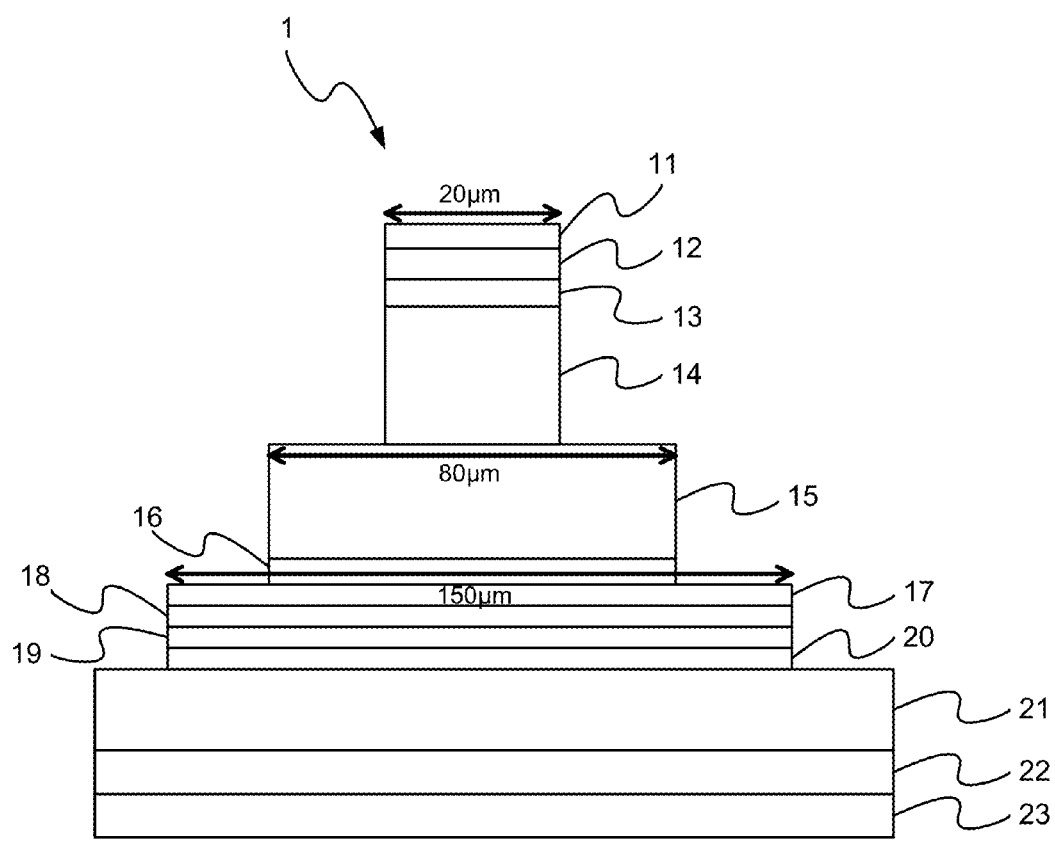
FIG. 1 is the sectional view showing the first preferred embodiment according to the present invention.

The following description of the preferred embodiments is provided to understand the features and the structures of the present invention.

Please refer to FIG. 1-FIG. 4, which are sectional views showing a first and a second preferred embodiments according to the present invention; and views showing a one-dimensional and a two-dimensional field distributions under breakdown operation. As shown in the figures, the present invention is a photodetecting device having field confined by mesas (Avalanche Photodiode, APD), which, from top to bottom, comprises a p-type ohmic contact layer 11, a window layer 12, a first graded bandgap layer 13, a first absorption layer 14, a second absorption layer 15, a second graded bandgap layer 16, a field buffer layer 17, a first p-type field control layer 18, a multiplication layer 19, an n-type contact layer 20 and an n-type ohmic contact layer 21. The present invention is a device of 'n-side (M-layer) down' epitaxial layers 1 having a first mesa between the first absorption layer 14 and the second absorption layer and a second mesa between the second graded bandgap layer 16 and the field buffer layer 17 for confining electric field by the first mesa and the second mesa.

The p-type ohmic contact layer 11 is a layer of p⁺-type doped indium gallium arsenide (InGaAs) to be used as a p-type electrode; and a p-type conductive metal layer (not shown in the figures) can be further obtained on the p-type ohmic contact layer 11. Therein, the p-type ohmic contact layer 11 has a thickness of 15~60 nanometers (nm).

The window layer 12 is a layer of p⁺-type doped indium phosphide (InP) or aluminum indium arsenide (InAlAs) and is inserted between the p-type ohmic contact layer 11 and the n-type ohmic contact layer 21. Therein, the window layer 12 has a thickness of 150~250 nm.

The first graded bandgap layer 13 is a layer of multilayered graded p⁺-type doped aluminum indium gallium arsenide (InAlGaAs) or indium gallium arsenide phosphide (InGaAsP) and is inserted between the window layer 12 and the n-type ohmic contact layer 21. Therein, the first graded bandgap layer 13 has a thickness of 15-25 nm.

The first absorption layer 14 is a layer of graded p⁻-type doped InGaAs and is inserted between the first graded bandgap layer 13 and the n-type ohmic contact layer 21. Therein, the first absorption layer 14 has a thickness of 300~450 nm.

The second absorption layer 15 is a layer of undoped InGaAs and is inserted between the first absorption layer 14 and the n-type ohmic contact layer 21. Therein, the second absorption layer 15 has a thickness of 495~745 nm.

The second graded bandgap layer 16 is a layer of undoped InAlGaAs or InGaAsP and is inserted between the second absorption layer 15 and the n-type ohmic contact layer 21. Therein, the second graded bandgap layer 16 has a total thickness of 10-20 nm.

The field buffer layer 17 is a layer of undoped InAlAs and is inserted between the second graded bandgap layer 16 and the n-type ohmic contact layer 21. Therein, the field buffer layer 17 has a thickness of 6.5-9.5 nm.

The first p-type field control layer 18 is a layer of p⁻-type doped InAlAs and is inserted between the field buffer layer 17 and the n-type ohmic contact layer 21. Therein, the first p-type field control layer 18 has a thickness of 30-50 nm.

The multiplication layer 19 is a layer of undoped InAlAs and is inserted between the first p-type field control layer 18 and the n-type ohmic contact layer 21. Therein, the multiplication layer 19 has a thickness less than 100 nm.

The n-type contact layer 20 is a layer of n⁻-type doped InAlAs and is inserted between the multiplication layer 19 and the n-type ohmic contact layer 21. Therein, the n-type contact layer 20 has a thickness of 150-250 nm.

The n-type ohmic contact layer 21 is a layer of n⁺-type doped InP to be used as an n-type electrode and the n-type ohmic contact layer 21 can further comprise an n-type conductive metal layer (not shown in the figures). Therein, the n-type ohmic contact layer 21 has a thickness of 800-1200 nm.

The epitaxial layers 1 is grown on a semi-insulating or conductive semiconductor substrate 23 and a buffer layer 22 is further obtained between the n-type ohmic contact layer 21 and the semiconductor substrate 23. Therein, the semiconductor substrate 23 is a semiconductor made of a compound, such as gallium arsenide (GaAs), gallium antimonide (GaSb), InP or gallium nitride (GaN); or a group IV element semiconductor, such as silicon (Si). The buffer layer 22 is made of InP having a thickness of 40-60 nm.

Thus, a novel photodetecting device having field confined by mesas is obtained.

(MBE), metalorganic chemical vapor deposition (MOCVD), hydride vapor phase epitaxy (hydride vapor Phase epitaxy, HVPE) and other methods for forming the epitaxial layers on the semiconductor substrate 23.

The materials of the photodetecting device having the epitaxial layers are shown in Table 1.

TABLE 1

| Composition | Material | x | Thickness (Å) | Dop | Energy level (/cm$^3$) | Type |
|---|---|---|---|---|---|---|
| p-type ohmic contact layer | $In_{(x)}Ga_{(1-x)}As$ | 0.53 | 200-500 | Be | >5E+19 | P+ |
| window layer | InP/InAlAs | | 2000 | Be | >5E+18 (as high as possible) | P+ |
| first graded bandgap layer | | | | | | |
| PL = 1.0 um Q layer | InAlGaAs/InGaAsP SL | | 50 | Be | 5.00E+18 | P+ |
| PL = 1.2 um Q layer | InAlGaAs/InGaAsP SL | | 50 | Be | 5.00E+18 | P+ |
| PL = 1.4 um Q layer | InAlGaAs/InGaAsP SL | | 50 | Be | 5.00E+18 | P+ |
| PL = 1.6 um Q layer | InAlGaAs/InGaAsP SL | | 50 | Be | 5.00E+18 | P+ |
| first absorption layer | $In_{(x)}Ga_{(1-x)}As$ | 0.53 | 3800 | Be | 5.00E+19 (top) to 1.00E+17 (bottom) | graded P |
| second absorption layer | $In_{(x)}Ga_{(1-x)}As$ | 0.53 | 6200 | | | |
| second graded bandgap layer | | | | | | |
| PL = 1.6 um Q layer | InAlGaAs/InGaAsP SL | | 50 | | | |
| PL = 1.4 um Q layer | InAlGaAs/InGaAsP SL | | 50 | | | |
| PL = 1.2 um Q layer | InAlGaAs/InGaAsP SL | | 50 | | | |
| second p-type field control layer | InP | | 400 | Be | 4.30E+17 | P |
| separating layer | InP | | 1600 | — | — | |
| field buffer layer | $In_{(x)}Al_{(1-x)}As$ | 0.52 | 80 | | | |
| first p-type field control layer | $In_{(x)}Al_{(1-x)}As$ | 0.52 | 400 | Be | 1.46E+18 | P |
| multiplication layer | $In_{(x)}Al_{(1-x)}As$ | 0.52 | 1000 | — | — | — |
| n-type contact layer | $In_{(x)}Al_{(1-x)}As$ | 0.52 | 2000 | Si | 5.0E+18 | N |
| n-type ohmic contact layer | InP | | 10000 | Si | 1.0E+19 | N+ |
| buffer layer | InP | | 500 | — | — | — |
| semiconductor substrate | 3″ S.I. InP | | | | | |

The p-type ohmic contact layer 11 is a layer of p$^+$-type $In_xGa_{1-x}As$; the first absorption layer 14 is a layer of graded bandgap $In_xGa_{1-x}As$; the second absorption layer 15 is a layer of undoped $In_xGa_{1-x}As$; and x is 0.53.

The field buffer layer 17 is a layer of undoped $In_xAl_{1-x}As$; the first p-type field control layer 18 is a layer of p$^-$-type $In_xAl_{1-x}As$; the multiplication layer 19 is a layer of undoped $In_xAl_{1-x}As$ (whose energy level is 1.45 electron-volts (eV)); the n-type contact layer 20 is a layer of n$^-$-type $In_xAl_{1-x}As$; and x is 0.52. Therein, the multiplication layer can further be a layer of undoped combination of $In_xAl_{1-x}As$ and $In_{x1}Al_{1-x1}As$ (whose energy level is higher than 1.45 eV); x is 0.52; and x1 is a positive number smaller than 0.52.

Figure 2:
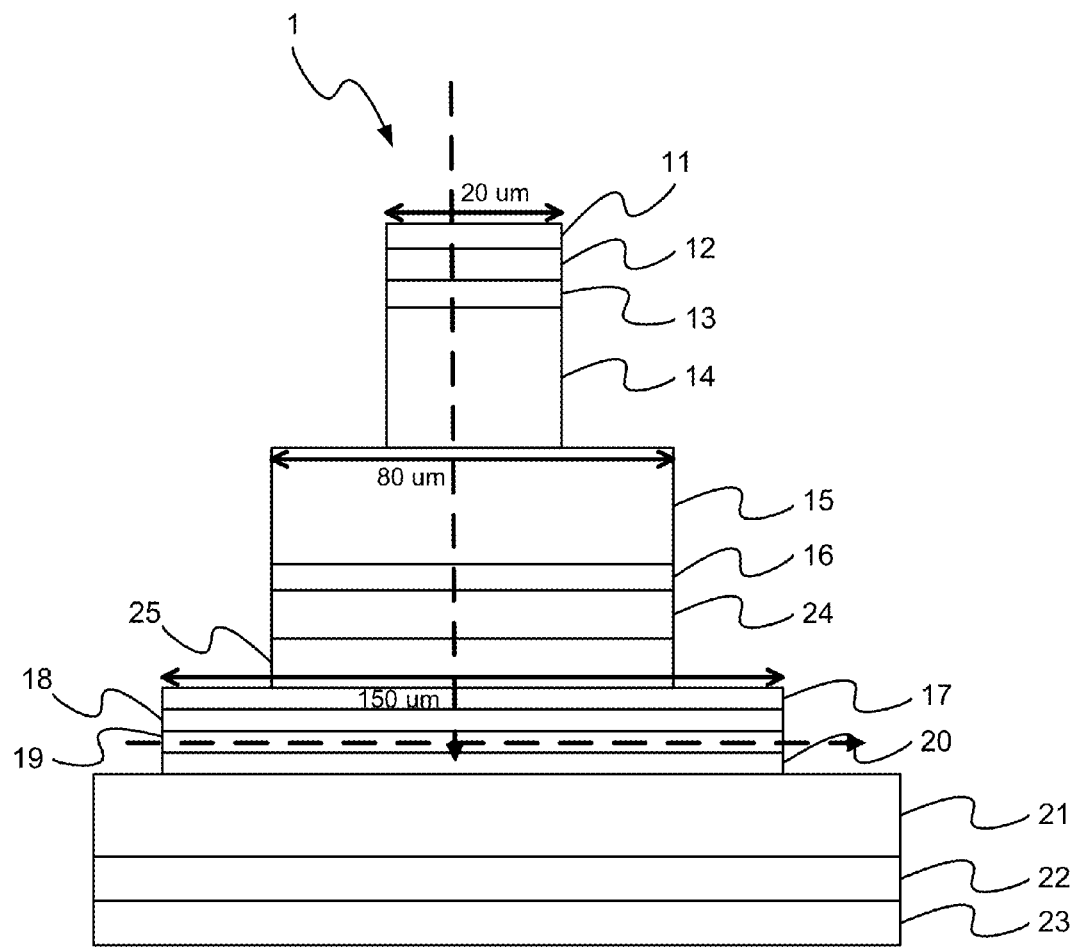
FIG. 2 is the sectional view showing the second preferred embodiment.

A second preferred embodiment is shown in FIG. 2. The photodetecting device can further comprise a second p-type field control layer 24 and a spacer layer 25. The second p-type field control layer 24 is inserted between the second graded bandgap layer 16 and the spacer layer 25 and has a thickness of 30-50 nm; and the spacer layer 25 is inserted between the second p-type field control layer 24 and the field buffer layer 17 and has a thickness of 130-190 nm. In such epitaxial layers with cathode located underneath, a first mesa between the first absorption layer 14 and the second absorption layer 15 and a second mesa between the spacer layer 25 and the field buffer layer 17 are obtained to confine electric field by the first mesa and the second mesa.

Figure 3:
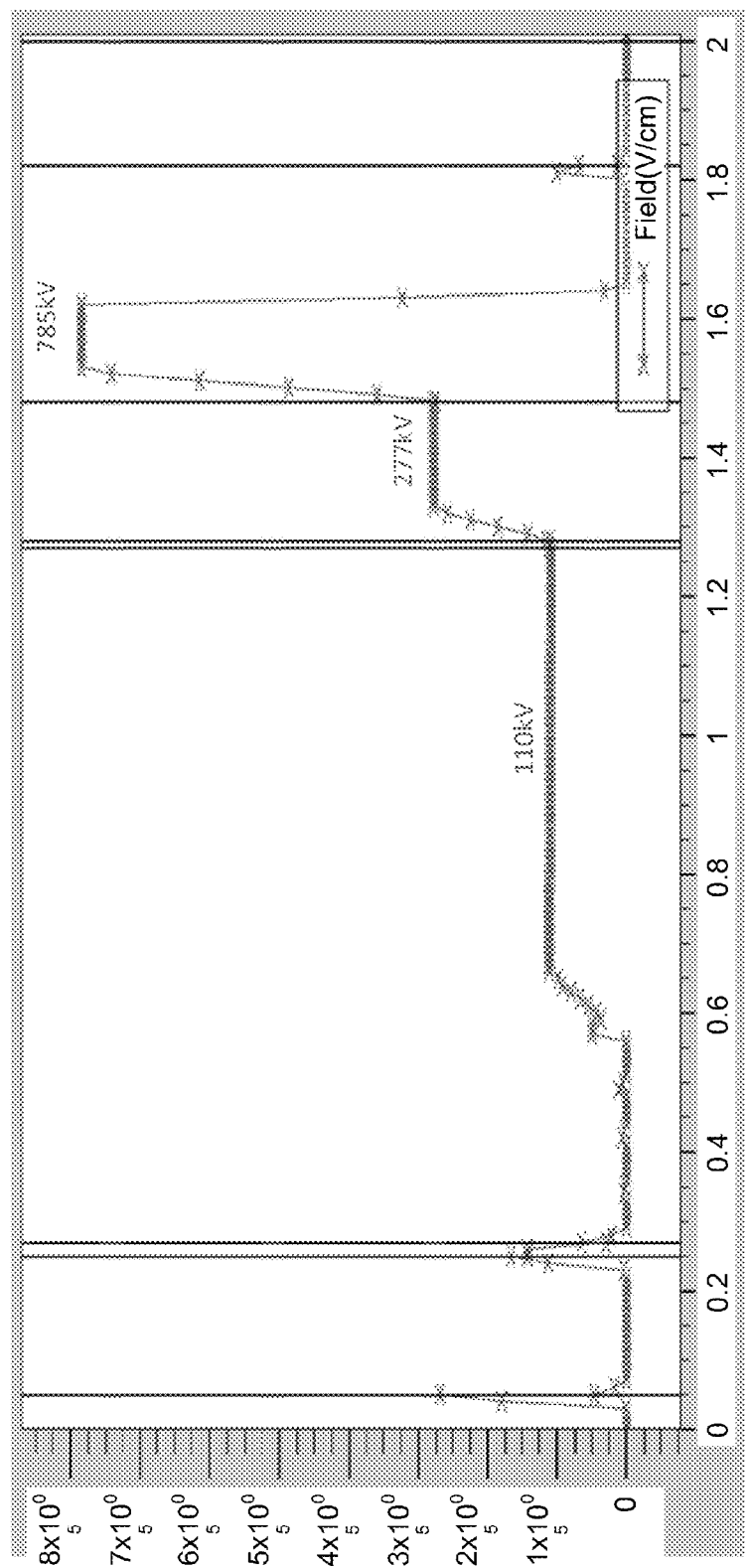
FIG. 3 is the view showing the one-dimensional field distribution under breakdown operation.

Methods for growing the epitaxial layers are not limited, which include preferred ones like molecular beam epitaxy Under consideration of reliability, the present invention uses epitaxial layers having cathode located underneath, so that the area having the strongest electric field in the multiplication layer 19 is buried inside the bottom in order to avoid surface breakdown. Furthermore, by using double mesa (as shown in FIG. 2), the multiplication layer 19 confines electric field. The main capacitance of the photodetecting device is determined by the topmost mesa at 20 micrometers (um); and, for effectively reducing the electric field of the InGaAs layer, an InP layer (i.e. the spacer layer 25) is obtained above the multiplication layer 19. As comparing to an InGaAs layer, the InP layer has a larger breakdown field (500 vs. 150 kilo-volts per centimeter (kV/cm)). Not only extra electric field is sustained, but also the absorption layers 14,15 are prevented from breakdown. FIG. 3 shows a one-dimensional field distribution under breakdown operation. According to FIG. 2, multiplication only happens at the InAlAs layer in FIG. 3 and has a greater distribution than the breakdown field (785 kV/cm >550 kV/cm). All of the other InGaAs and InP layers have field value smaller than their corresponding breakdown fields (<500 volts per centimeter (V/cm)).

Figure 4:
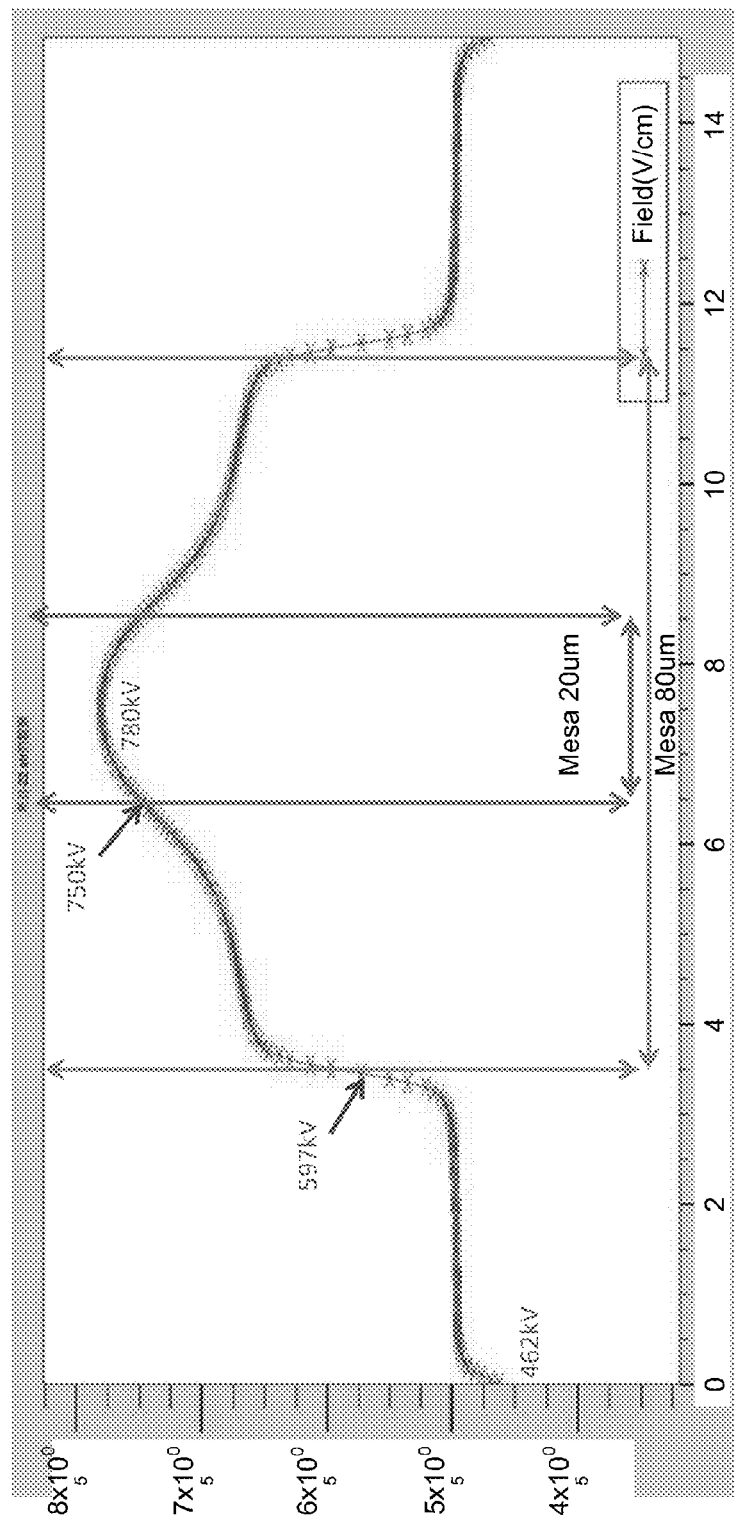
FIG. 4 is the view showing the two-dimensional field distribution under breakdown operation.
Figure 5:
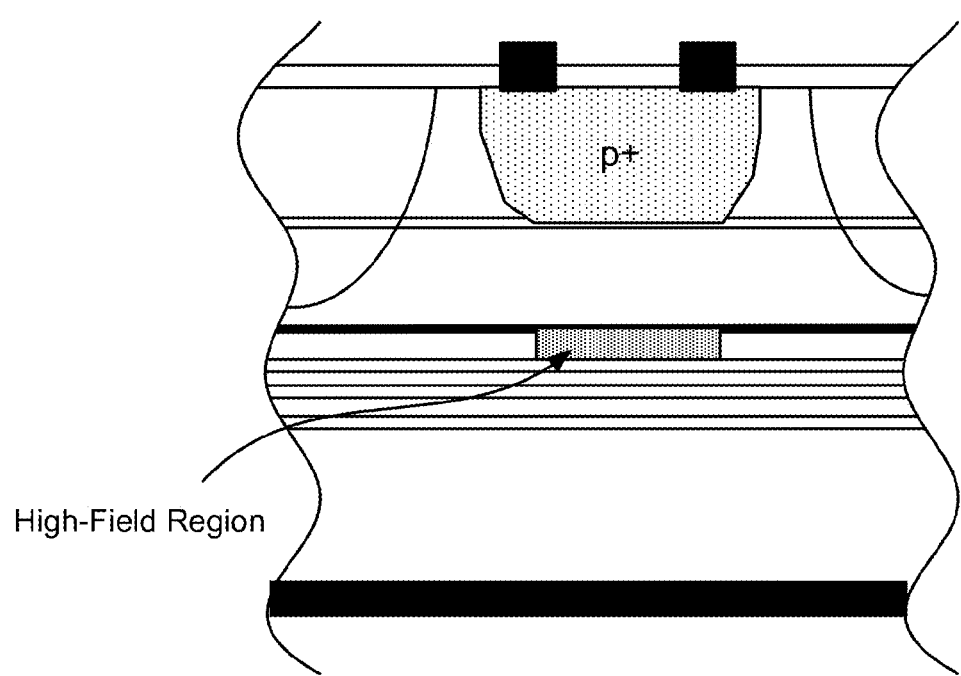
FIG. 5 is the sectional view of the first prior art.
Figure 6:
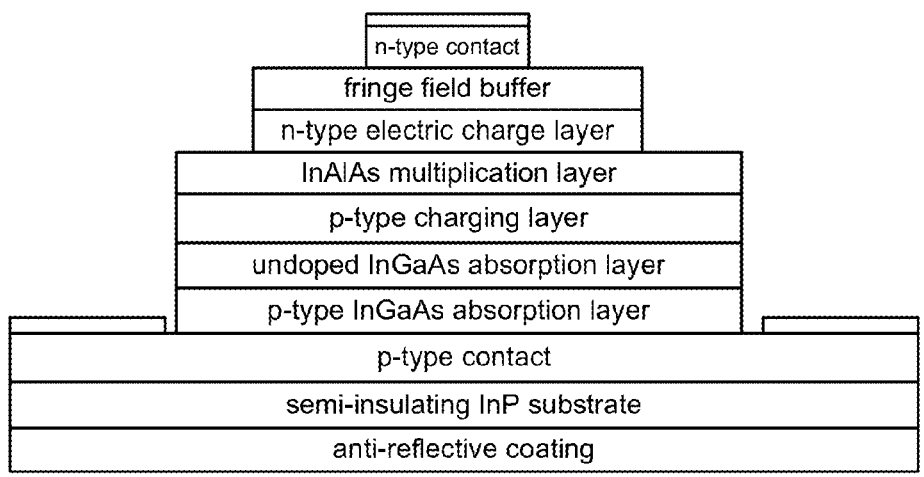
FIG. 6 is the sectional view of the second prior art.

FIG. 4 shows a two-dimensional electric field distribution. According to FIG. 2, a strongest electric field (>550 kV/cm) is focused at inner side of mesa at 20 um and 80 um. The outer field surrounding the real multiplication layer 19 is effectively suppressed at 460-550 kV/cm to avoid side-wall breakdown. It proves that the mesas confine the electric field with M-layer side down. The present invention can further integrate an APD chip on sub-mount and a transimpedance amplifier (TIA) for sensitivity detection.

The present invention provides a novel multiplication layer, composite multiplication layer, with an ultrathin thickness (<100 nm) for increasing gain-bandwidth product. The novel multiplication layer comprises a lattice-matching InAlAs layer and a stressed and wide-bandgap InAlAs layer. The wide-bandgap layer can reduce the tunneling dark current and further shrink the thickness of equivalent multiplication layer for enhancing sensitivity. Hence, the present invention can mass-produce 50 giga-bits per second (Gbit/sec) APD for superseding p-i-n photodetectors.

To sum up, the present invention is a photodetecting device having field confined by mesas, where epitaxial layers having an M-layer side down as a cathode is formed to confine strongest field of the multiplication layer inside bottom to avoid surface breakdown; double mesa is used to confine the field of the multiplication layer; a composite multiplication layer is obtained to reduce tunneling dark current with supper thin thickness and wide bandgap; and the thickness of equivalent multiplication layer is shrunken for enhancing sensitivity.

The preferred embodiments herein disclosed are not intended to unnecessarily limit the scope of the invention. Therefore, simple modifications or variations belonging to the equivalent of the scope of the claims and the instructions disclosed herein for a patent are all within the scope of the present invention.

What is claimed is:

1. A photodetector device, comprising
a p-type ohmic contact layer, said p-type ohmic contact layer being a first p+-type doped semiconductor;
an n-type ohmic contact layer, said n-type ohmic contact layer being a second n$^+$ type doped semiconductor;
a window layer, said window layer being a third p+-type doped semiconductor, said window layer being located between said p-type ohmic contact layer and said n-type ohmic contact layer;
a first graded bandgap layer, said first graded bandgap layer being a fourth p+ type doped semiconductor, said first graded bandgap layer being located between said window layer and said n-type ohmic contact layer;
a first absorption layer, said first absorption layer being a fifth p− type doped semiconductor, said first absorption layer being located between said first graded bandgap layer and said n-type ohmic contact layer;
a second absorption layer, said second absorption layer being a sixth undoped semiconductor, said second absorption layer being located between said first absorption layer and said n-type ohmic contact layer;
a second graded bandgap layer, said second graded bandgap layer being a seventh undoped semiconductor, said second graded bandgap layer being located between said second absorption layer and said n-type ohmic contact layer;
a field buffer layer, said field buffer layer being an eighth undoped semiconductor, said field buffer layer being located between said second graded bandgap layer and said n-type ohmic contact layer;
a first p-type field control layer, said first p-type field control layer being a ninth p--type doped semiconductor, said first p-type field control layer being located between said field buffer layer and said n-type ohmic contact layer;
a multiplication layer, said multiplication layer being a tenth undoped semiconductor, said multiplication layer being located between said first p-type field control layer and said n-type ohmic contact layer; and
an n-type contact layer, said n-type contact layer being an eleventh n$^-$-type doped semiconductor, said n-type contact layer being located between said multiplication layer and said n-type ohmic contact layer,
wherein the n-side multiplication-layer down photodetector device has a first mesa between said first absorption layer and said second absorption layer and a second mesa between said second graded bandgap layer and said field buffer layer to confine the electric field inside the photodetector device by said first mesa and said second mesa.

2. The photodetecting device according to claim 1, wherein said epitaxial layers are grown on a semiconductor substrate selected from a group consist of a semi-insulating semiconductor substrate and a conductive semiconductor substrate; and a buffer layer is further obtained between said n-type ohmic contact layer and said semiconductor substrate.

3. The photodetecting device according to claim 1, wherein the photodetecting device further comprises a second p-type field control layer and a spacer layer; said second p-type field control layer is located between said second graded bandgap layer and said spacer layer; and said spacer layer is located between said second p-type field control layer and said field buffer layer.

4. The photodetecting device according to claim 1, wherein said p-type ohmic contact layer is a layer of p$^+$-type indium gallium arsenide (InGaAs); said window layer is a layer of a material selected from a group consist of p$^+$-type indium phosphide (InP) and p$^+$-type indium aluminum arsenide (InAlAs); said first graded bandgap layer is a layer of p$^+$-type indium aluminum gallium arsenide (InAlGaAs); said first absorption layer is a layer of p$^-$-type doped InGaAs; said second absorption layer is a layer of undoped InGaAs; said second graded bandgap layer is a layer of undoped InAlGaAs; said field buffer layer is a layer of undoped InAlAs; said first p-type field control layer is a layer of p$^-$-type InAlAs; said multiplication layer is a layer of undoped InAlAs; said n-type contact layer is a layer of n$^-$-type InAlAs; and said n-type ohmic contact layer is a layer of n$^+$-type InP.

5. The photodetecting device according to claim 4, wherein said p-type ohmic contact layer is a layer of p$^+$-type In$_x$Ga$_{1-x}$As; said first absorption layer is a layer of graded bandgap In$_x$Ga$_{1-x}$As; said second absorption layer is a layer of undoped In$_x$Ga$_{1-x}$As; and x is 0.53.

6. The photodetecting device according to claim 4, wherein said field buffer layer is a layer of undoped In$_x$Al$_{1-x}$As; said first p-type field control layer is a layer of p$^-$-type In$_x$Al$_{1-x}$As; said multiplication layer is a layer of undoped In$_x$Al$_{1-x}$As; said n-type contact layer is a layer of n$^-$-type In$_x$Al$_{1-x}$As; and x is 0.52.

7. The photodetecting device according to claim 6, wherein said multiplication layer is a layer of undoped combination of In$_x$Al$_{1-x}$As and In$_{x1}$Al$_{1-x1}$As; x is 0.52; and x1 is a positive number smaller than 0.52.

8. The photodetecting device according to claim 1, wherein said p-type ohmic contact layer is a layer of p$^+$-type InGaAs; said window layer is a layer of a material selected from a group consist of p$^+$-type InP and p$^+$-type InAlAs; said first graded bandgap layer is a layer of p$^+$-type indium gallium arsenide phosphide (InGaAsP); said first absorption layer is a layer of p$^-$-type graded doped InGaAs; said second absorption layer is a layer of undoped InGaAs; said second graded bandgap layer is a layer of undoped InGaAsP; said field buffer layer is a layer of undoped InAlAs; said first p-type field control layer is a layer of p⁻-type InAlAs; said multiplication layer is a layer of undoped InAlAs; said n-type contact layer is a layer of n⁻-type InAlAs; and said n-type ohmic contact layer is a layer of n⁺-type InP.

9. The photodetecting device according to claim 8, wherein said p-type ohmic contact layer is a layer of p⁺-type $In_xGa_{1-x}As$; said first absorption layer is a layer of graded bandgap $In_xGa_{1-x}As$; said second absorption layer is a layer of undoped $In_xGa_{1-x}As$; and x is 0.53.

10. The photodetecting device according to claim 8, wherein said field buffer layer is a layer of undoped $In_xAl_{1-x}As$; said first p-type field control layer is a layer of p⁻-type $In_xAl_{1-x}As$; said multiplication layer is a layer of undoped $In_xAl_{1-x}As$; said n-type contact layer is a layer of n⁻-type $In_xAl_{1-x}As$; and x is 0.52.

11. The photodetecting device according to claim 8, wherein said multiplication layer is a layer of undoped combination of $In_xAl_{1-x}As$ and $In_{x1}Al_{1-x1}As$; x is 0.52; and x1 is a positive number smaller than 0.52.

12. The photodetecting device according to claim 1, wherein said multiplication layer has a thickness of 100±20 nanometers (nm).

13. The photodetecting device according to claim 1, wherein said first graded bandgap layer is a layer of multi-layered graded p⁺-type doped material selected from a group consist of InAlGaAs and InGaAsP; and has a total thickness of 15-25 nm.

14. The photodetecting device according to claim 1, wherein said second graded bandgap layer is a layer of multilayered graded undoped material selected from a group consist of InAlGaAs and InGaAsP; and has a total thickness of 10~20 nm.

\* \* \* \* \*